US010182520B2

(12) United States Patent
Shibata

(10) Patent No.: US 10,182,520 B2
(45) Date of Patent: Jan. 15, 2019

(54) MOUNTING MANAGEMENT DEVICE, MOUNTING PROCESS DEVICE, MOUNTING SYSTEM, MOUNTING MANAGEMENT METHOD, AND MOUNTING PROCESS METHOD

(71) Applicant: FUJI CORPORATION, Chiryu (JP)

(72) Inventor: Mitsuhiko Shibata, Toyota (JP)

(73) Assignee: FUJI CORPORATION, Chiryu (JP)

( * ) Notice: Subject to any disclaimer, the term of this patent is extended or adjusted under 35 U.S.C. 154(b) by 224 days.

(21) Appl. No.: 14/899,453

(22) PCT Filed: Jun. 18, 2013

(86) PCT No.: PCT/JP2013/066716
§ 371 (c)(1),
(2) Date: Dec. 17, 2015

(87) PCT Pub. No.: WO2014/203331
PCT Pub. Date: Dec. 24, 2014

(65) Prior Publication Data
US 2016/0150687 A1    May 26, 2016

(51) Int. Cl.
*H05K 13/08*    (2006.01)
*G05B 19/418*    (2006.01)

(52) U.S. Cl.
CPC ........... *H05K 13/08* (2013.01); *G05B 19/418* (2013.01); *G05B 2219/45031* (2013.01)

(58) Field of Classification Search
CPC .............................. H05K 13/08; G05B 19/418
See application file for complete search history.

(56) References Cited

U.S. PATENT DOCUMENTS 4,802,816 A * 2/1989 Mezhinsky ........ H05K 13/0015
294/119.1
5,325,305 A    6/1994 Rezaei
(Continued)

FOREIGN PATENT DOCUMENTS

| JP | 62-22498 A | 1/1987 | |
|----|------------|--------|----|
| JP | 1-76100 U  | 5/1989 | |
| JP | 2006-245483 | * 9/2006 | ............. H05K 13/04 |

OTHER PUBLICATIONS

International Search Report dated Jul. 30, 2013 in PCT/JP13/066716 Filed Jun. 18, 2013.

(Continued)

*Primary Examiner* — William Coleman
(74) *Attorney, Agent, or Firm* — Oblon, McClelland, Maier & Neustadt, L.L.P.

(57) ABSTRACT

In an electronic component mounting system, a mounting management server acquires measurement information relating to a result obtained by measurement of a component which is stored in a reel, registers the acquired measured information in the device information in association with a reel ID, and outputs the measurement information corresponding to the reel to a mounting machine during a mounting process. The mounting process device receives the device information in which the measurement information that relates to the result obtained by measuring the component stored in the reel and that is associated with the reel ID is registered, when the measurement information is present in the device information of the component to be mounted, the mounting process device executes the mounting process of the component.

14 Claims, 8 Drawing Sheets

(56) References Cited

U.S. PATENT DOCUMENTS

| | | | |
|---|---|---|---|
| 6,296,434 B1* | 10/2001 | Sato | H05K 13/0408 198/339.1 |
| 6,778,878 B1 | 8/2004 | Kou | |
| 6,931,714 B2* | 8/2005 | Wisecarver | G02B 7/023 100/289 |
| 7,899,561 B2* | 3/2011 | Maenishi | H05K 13/08 29/743 |
| 9,929,061 B2* | 3/2018 | Cho | H01L 22/10 |
| 2017/0181342 A1* | 6/2017 | Low | H05K 13/0417 |

OTHER PUBLICATIONS

Extended European Search Report dated Sep. 26, 2016 in Patent Application No. 13887514.1.
Office Action dated Jan. 31, 2018 in Chinese Patent Application No. 201380077544.1 (submitting English language translation only).
Office Action dated May 31, 2017 in Japanese Patent Application No. 2015-522402 (English translation only).

* cited by examiner

MOUNTING MANAGEMENT DEVICE, MOUNTING PROCESS DEVICE, MOUNTING SYSTEM, MOUNTING MANAGEMENT METHOD, AND MOUNTING PROCESS METHOD

TECHNICAL FIELD

The present application relates to a mounting management device, a mounting process device, a mounting system, a mounting management method, and a mounting process method.

BACKGROUND ART

In the related art, a mounting process device is proposed in which, during the mounting process of mounting, to a printed circuit board, a chip component from a reel in which a plurality of chip components are successively wrapped, a numerical constant (for example, a resistance value or the like) of a predetermined number of the chip components of a leading portion is measured (for example, refer to PTL 1). In recent years, chip components have become miniaturized, it is difficult to confirm the numerical constant such as the resistance value of the component from the appearance, and the chip component is determined by description on the reel. At this time, although there are cases in which a reel is installed in a device erroneously, in which a wrong chip component is contained in the reel from the beginning, and the like, in this device, since the numerical constant of a predetermined number of the chip components is measured before the mounting process, it is possible to prevent erroneous mounting of components before it happens.

CITATION LIST

Patent Literature

PTL 1: JP-UM-A-01-76100

SUMMARY

Problem to be Solved

However, in the mounting process device which is described in PTL 1, although an increase in the number of times the numerical constant of the components is measured is prevented by measuring only a predetermined number of the leading portion, there are cases in which changing of the installed components must be confirmed, for example, after the reel is reinstalled, after the power is turned back on, and the like, and the measurement is performed repeatedly. Therefore, there is a problem in that the time taken in the overall mounting process becomes longer.

The disclosure is made in consideration of this problem, and the main object is to provide a mounting management device, a mounting process device, a mounting system, a mounting management method, and a mounting process method capable of further reducing the frequency of the confirmation measurement of the components and executing the mounting process more smoothly.

Means for Solving the Problem

The disclosure adopts the following device in order to achieve the above-described main object.

That is, a mounting management device of the disclosure is a mounting management device that manages information relating to a component of a mounting process device in which a storage section with the component stored therein is installed and which executes a mounting process to mount the component on a printed circuit board, and includes information acquisition device for acquiring measurement information relating to a result obtained by measurement of the component which is stored in the storage section, information storage device for storing device information in which the acquired measurement information that is associated with information relating to the storage section is registered, and output control device for outputting the measurement information corresponding to the storage section to at least one of the mounting process device and an external device.

The mounting management device acquires the measurement information relating to the result obtained by measurement of the component which is stored in the storage section, stores device information in which the acquired measurement information that is associated with information relating to the storage section is registered, and outputs the measurement information corresponding to the storage section to at least one of the mounting process device and the external device. In this manner, the result obtained by measurement of the component is registered in the device information and managed, and, for example, the measurement information is output according to a request of a worker, the mounting process device, or the like. Therefore, since it is not necessary to perform the re-measurement of the component due to using the measurement information, it is possible to further reduce the frequency of the confirmation measurement of the component and to execute the mounting process more smoothly. Here, the "measurement information" is information representing that the measurement has been performed, and may be information indicating that the storage section and the measured component have a correct correspondence relationship. The "information relating to the storage section" may be identification information with which it is possible to identify the storage section, for example. The "external device" may be a device other than a mounting process device, for example, the "external device" may be a measurement device which performs the confirmation measurement of the component, and may be a notification device which notifies a worker of the measurement information. The notification device may be a display device which outputs a display of the measurement information, for example. The "outputting of the measurement information" may be outputting of the measurement information, and may be outputting of the device information which contains the measurement information. Note that, "mount" includes placing, installing, inserting, joining, adhering, or the like of the component on the printed circuit board.

In the mounting management device of the disclosure, when the output control device acquires query information relating to whether the component which is stored in the storage section which is installed in the mounting process device has been measured from the mounting process device, the device information corresponding to the storage section of the query information may be read, and, if the measurement information is registered in the read device information, the output control device may output the measurement information to the mounting process device. In this case, since the measurement information which is registered in the device information is output according to the query from the mounting process device, it is possible to further reduce the frequency of the confirmation measurement of the component and to execute the mounting process more smoothly. At this time, the mounting control device may output non-measurement information to the mounting process device when the measurement information is not registered in the read device information. In this case, it is possible to prevent the erroneous mounting of the component in the mounting process device using the non-measurement information.

In the mounting management device of the disclosure, the information acquisition device may acquire the measurement information relating to information indicating that a correct component is stored in the storage section. In this case, since it is possible to ascertain that the correct component is stored in the storage section which is installed in the mounting process device, it is possible to further reduce the frequency of the confirmation measurement of the component and to execute the mounting process more smoothly.

The mounting management device of the disclosure may further include management determination device for determining whether or not the storage section and the measured component have a correct correspondence relationship based on information of the storage section and measurement result information of the component which is stored in the storage section, in which the information acquisition device may acquire the measurement information relating to the information indicating that the correct component is stored in the storage section. In this case, in the mounting management device, it is possible to determine whether the storage section and the component have the correct correspondence relationship, and it is possible to manage the measurement information more appropriately. At this time, the information storage device may store mounting condition information which contains the correspondence relationship between the storage section and the component and is used in the mounting process, and the management determination device may determine the correspondence relationship between the storage section and the measured component based on the stored mounting condition information.

Note that, the mounting process device may further include measuring device for measuring the component which is stored in the storage section, and measurement control device for causing the measuring device to measure the component which is stored in the storage section before execution of the mounting process when the received response information does not contain the measurement information, and the information acquisition device may acquire the measurement information from the mounting process device. Alternatively, the information acquisition device may acquire the measurement information from the measurement device which is provided with measuring device for measuring the component which is stored in the storage section.

A mounting process device of the disclosure communicates with a mounting management device that manages information relating to a component, in which a storage section with the component stored therein is installed, and which executes a mounting process to mount the component on a printed circuit board. The mounting process device includes reception device for receiving information, transmission device for transmitting information, and mounting control device for executing the mounting process of the component when measurement information relating to a result obtained by measurement of the component stored in the storage section is present.

In the mounting process device, when the measurement information relating to the result obtained by measurement of the component stored in the storage section is present, the mounting process to mount the component on the printed circuit board is executed. In this manner, since it is not necessary to perform the re-measurement of the component due to using the measurement information because the mounting process is executed according to the measurement information, it is possible to further reduce the frequency of the confirmation measurement of the component and to execute the mounting process more smoothly.

In the mounting process device of the disclosure, the transmission device may transmit query information relating to whether the component which is stored in the installed storage section has been measured to the mounting management device, the reception device may receive response information relating to the query information, and the mounting control device may determine whether or not the response information contains the measurement information relating to the result obtained by measurement of the component stored in the storage section, and, when the measurement information is present, may execute the mounting process of the component. In this case, by querying the mounting management device which performs the information management of the component, it is possible to further reduce the frequency of the confirmation measurement of the component and to execute the mounting process more smoothly.

In the mounting process device of the disclosure, the reception device may receive device information in which the measurement information that is relating to the result obtained by measurement of the component stored in the storage section and that is associated with the information relating to the storage section is registered, and, when the measurement information is present in the device information of the component to be mounted, the mounting control device may execute the mounting process of the component. In this case, by using the received device information, it is possible to further reduce the frequency of the confirmation measurement of the component and to execute the mounting process more smoothly.

In the mounting process device of the disclosure, the mounting control device may interrupt execution of the mounting process when the measurement information is not present. Since it is possible to prevent the erroneous mounting of the component, it is possible to execute the mounting process more smoothly. Here, "interrupting the mounting process" includes temporary stopping, and, for example, the mounting process may be restarted after the confirmation operation.

The mounting process device of the disclosure may further include measuring device for measuring the component which is stored in the storage section, and measurement control device for causing the measuring device to measure the component which is stored in the storage section before execution of the mounting process when the measurement information relating to the component which is stored in the storage section is not present. In this case, in the mounting process device, since it is possible to execute the mounting process after performing the measurement of the component, it is possible to further prevent the erroneous mounting of the component.

In the mounting process device of the disclosure which is provided with the measuring device, the transmission device may transmit the measurement result information to the mounting management device. In this case, since it is possible to use the measurement result information of the component in the mounting management device, it is possible to register the measurement information in the mounting management device. At this time, the mounting management device may further include management determination device for determining whether or not the storage section and the measured component have a correct correspondence relationship based on information of the storage section and measurement result information of the component which is stored in the storage section.

Alternatively, the mounting process device of the disclosure which is provided with a measuring device may further include mounting determination device for determining whether or not the storage section and the measured component have a correct correspondence relationship based on information of the storage section and measurement result information of the component which is stored in the storage section, in which the transmission device may transmit the measurement information relating to information indicating that the correct component is stored in the storage section to the mounting management device. In this case, it is possible to manage the measurement information in the mounting management device by using the measurement information which is obtained in the mounting process device.

A mounting system of the disclosure includes any of the mounting management devices described above, and any of the mounting process devices described above. In the mounting system, since the mounting management device and the mounting process device which are described above are provided, it is possible to further reduce the frequency of the confirmation measurement of the component and to execute the mounting process more smoothly. Since any of the mounting management devices described above and any one of the mounting process devices described above are provided, it is possible to obtain the effects corresponding to the modes which are adopted by the devices described above.

A mounting management method of the disclosure is a method of managing information relating to a component of a mounting process device in which a storage section with the component stored therein is installed and which executes a mounting process to mount the component on a printed circuit board. The mounting management method includes (a) a step of acquiring measurement information relating to a result obtained by measurement of the component which is stored in the storage section, (b) a step of storing device information in which the acquired measurement information that is associated with information relating to the storage section is registered, and (c) a step of outputting the measurement information corresponding to the storage section to at least one of the mounting process device and an external device.

In the mounting management method, in the same manner as the mounting management device described above, since it is not necessary to perform the re-measurement of the component due to using the measurement information because the result obtained by measurement of the component is registered in the device information and managed, and the measurement information is output according to a request of the mounting process device or the like, it is possible to further reduce the frequency of the confirmation measurement of the component and to execute the mounting process more smoothly. Note that, in the mounting management method, various modes of the mounting management device described above may be adopted, and, steps which achieve the functions of the mounting management device described above may be added.

A mounting process method of the disclosure for communicating with a mounting management device that manages information relating to a component, installing a storage section with the component stored therein, and executing a mounting process to mount the component on a printed circuit board. The mounting process method includes (d) a step of executing the mounting process when measurement information relating to a result obtained by measurement of the component which is stored in the storage section is present.

In the mounting process method, in the same manner as the mounting process device described above, since it is not necessary to perform the re-measurement of the component due to the mounting process being executed according to the measurement information which is managed by the mounting management device, it is possible to further reduce the frequency of the confirmation measurement of the component and to execute the mounting process more smoothly. Note that, in the mounting process method, various modes of the mounting process device described above may be adopted, and, steps which achieve the functions of the mounting process device described above may be added.

A program of the disclosure causes one or more computers to execute the steps of the mounting management method or the mounting process method described above. The program may be recorded on a recording medium (for example, a hard disk, a ROM, an FD, a CD, a DVD, or the like) which can be read by a computer, may be distributed from one computer to another computer via a transmission medium (a communication net such as the Internet or a LAN), and may be transferred in any other form. If a single computer is caused to execute the program, or, if the program is divided into the steps and a plurality of computers is caused to execute the steps, since the steps of the mounting management method or the mounting process method described above are executed, the same operational effects as the methods may be obtained.

DESCRIPTION OF EMBODIMENTS

Figure 1:
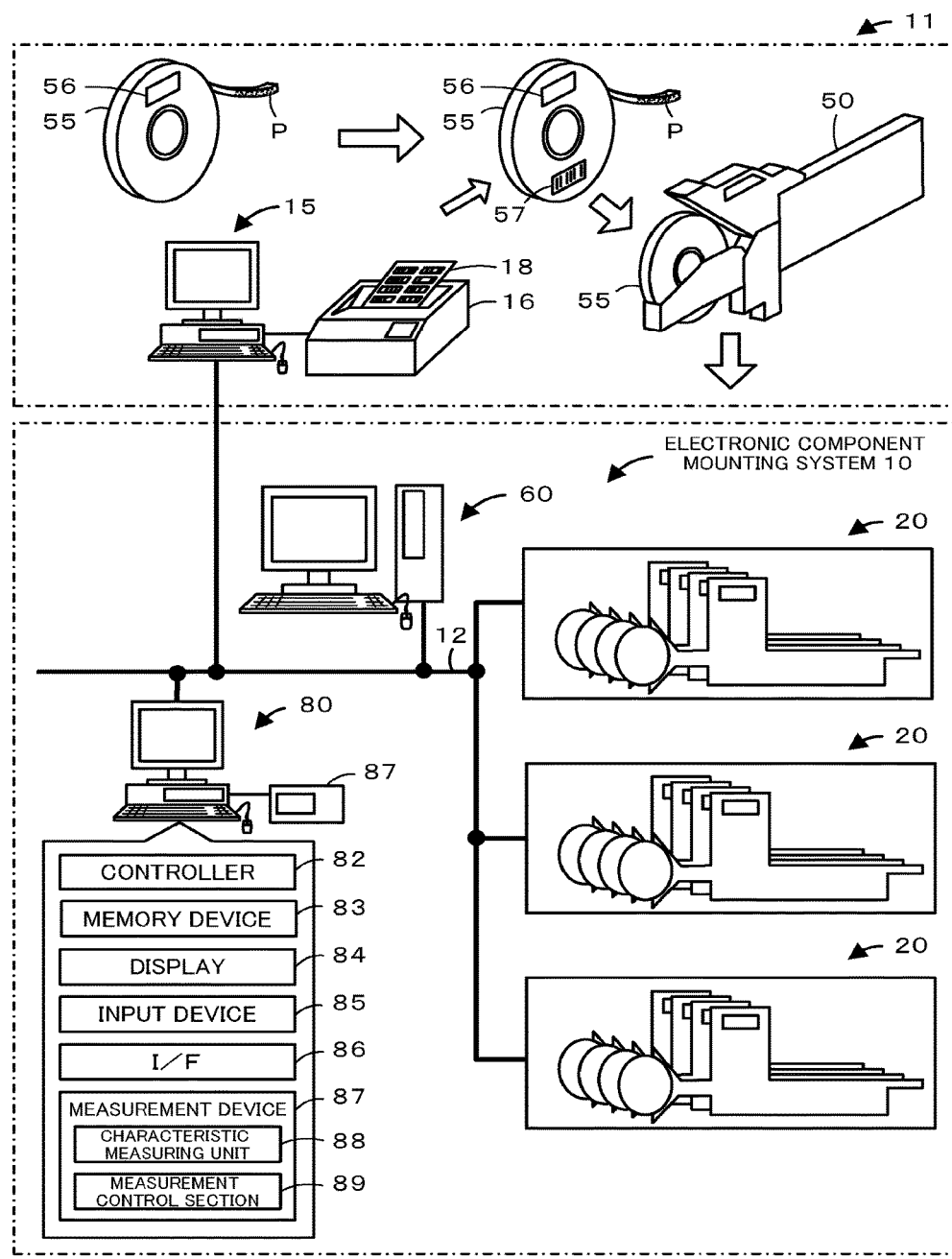
FIG. 1 is a configuration diagram schematically illustrating the configuration of an electronic component mounting system 10 of the disclosure.
Figure 2:
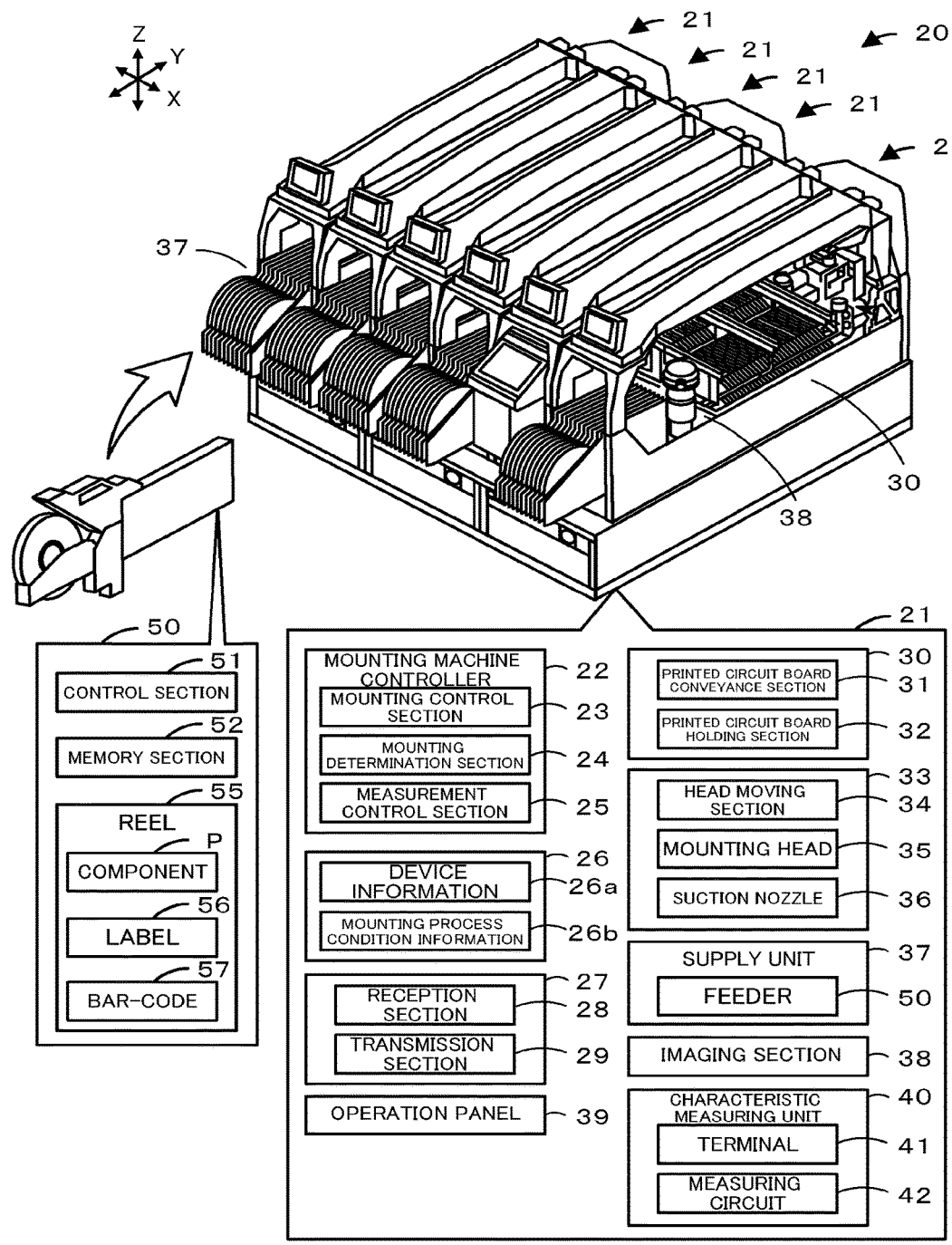
FIG. 2 is a configuration diagram schematically illustrating the configuration of a mounting process device 20.

Next, description will be given of an embodiment of the disclosure using the drawings. FIG. 1 is a configuration diagram schematically illustrating the configuration of an electronic component mounting system 10 of an embodiment of the disclosure. FIG. 2 is a configuration diagram schematically illustrating the configuration of a mounting process device 20 of an embodiment of the disclosure. FIG.

Figure 4:
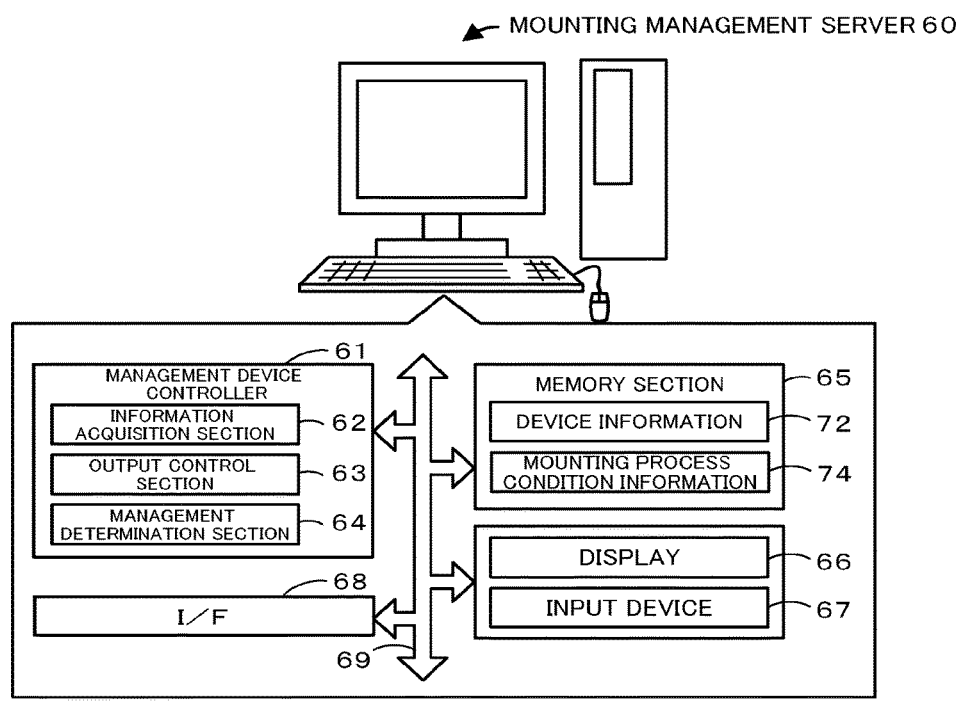
FIG. 4 is a configuration diagram schematically illustrating the configuration of a mounting management server 60.

3 is a configuration diagram schematically illustrating the configuration of a characteristic measuring unit 40 provided in a mounting machine 21. FIG. 4 is a configuration diagram schematically illustrating the configuration of a mounting management server 60 of an embodiment of the disclosure. As illustrated in FIG. 1, the electronic component mounting system 10 is, for example, arranged in a production area such as inside a factory, and is provided with a LAN 12 as a network, a plurality of the mounting process devices 20 which are connected to the LAN 12, the mounting management server 60 which is connected to the LAN 12, and a measurement PC 80 which is connected to the LAN 12. The mounting process devices 20 are devices which perform a process in which a component P is installed (mounted) on a printed circuit board using one or more reels 55 in which a plurality of the components P are stored. With regard to the reel 55 which is received from a vendor, management and storage is performed in a warehousing area 11. A personal computer (PC) PC 15 which is connected to the LAN 12 and is for performing registration and the like of the reel 55, a printer 16 which is connected to the PC 15, and the like are provided in the warehousing area 11. The PC 15 is provided with a controller which is not depicted in the drawings, a memory device, a display, and an input device, and has a function of executing an operation corresponding to an input operation when a worker performs the input operation of a cursor or the like which is displayed on the display via the input device. The printer 16 is a device which prints an identifier (ID) of the reel which is registered in the PC 15 onto a sheet 18 as a bar-code format.

As illustrated in FIG. 2, a plurality of the mounting machines 21 in which are installed the reels 55 and trays which store various components P are connected to the mounting process device 20, and the mounting process device 20 is configured as a mounting line which transports printed circuit boards and mounts components P. The mounting machine 21 is the mounting process device of the disclosure, and is provided with a mounting machine controller 22 which manages the control of the overall device, a memory section 26 which stores various data, and a network interface (I/F) 27 which performs communication with devices which are connected to the LAN 12. The mounting machine 21 is provided with an imaging section 38 which images the component P which is held in a suction nozzle 36 or the like, and an operation panel 39 on which a display screen is displayed and with which a worker is capable of various input operations. The mounting machine 21 is provided with a printed circuit board processing unit 30 which executes transporting and clamping of a printed circuit board as a unit which executes the mounting process, a pick-and-place processing unit 33 which executes a process of disposing the component P on the printed circuit board, a supply unit 37 which supplies the component P which is stored in the reel 55 or the tray to a predetermined pickup position, and the characteristic measuring unit 40 which measures the electrical characteristics of the component P.

The mounting machine controller 22 is configured as a micro processor centered on a CPU which is not depicted in the drawings and is provided with flash memory in which various processing programs and the like are stored, and a RAM which stores data temporarily. The mounting machine controller 22 is electrically connected to the memory section 26, the imaging section 38, the operation panel 39, the printed circuit board processing unit 30, the pick-and-place processing unit 33, the supply unit 37, and the like using a bus which is not depicted in the drawings. The mounting machine controller 22 outputs signals which control the printed circuit board processing unit 30, the pick-and-place processing unit 33, or the supply unit 37, outputs data to external devices which are connected to the LAN 12 via the I/F 27, and outputs display data to the operation panel 39. The mounting machine controller 22 receives input of data from the external devices which are connected to the LAN 12 via the I/F 27, receives input of data which is input to the operation panel 39, and the like.

The mounting machine controller 22 is provided with a mounting control section 23, a mounting determination section 24, a measurement control section 25, and the like as functional blocks. The mounting control section 23 controls the printed circuit board processing unit 30 and the pick-and-place processing unit 33 so as to execute the mounting process to mount the component P on the printed circuit board according to measurement information relating to the results of measuring the electrical characteristics of the component P. When the measurement information is present in device information 26a, in which the measurement information that relates to the results of measuring the component P which is stored in the reel 55 is registered corresponding to a reel ID which is the identifier of the reel 55, and that is received from the mounting management server 60, the mounting control section 23 performs the process in which the mounting process of the component P is executed. When the measurement information of the specific component P is not present in the device information 26a, the mounting control section 23 performs a process in which the execution of the mounting process is temporarily interrupted. The mounting determination section 24 performs a process of determining whether or not the reel 55 and the measured component P are in the correct correspondence relationship based on the information of the reel 55 and the measurement result information of the electrical characteristics of the component P which is stored in the reel 55. The measurement control section 25 measures the electrical characteristics of the component P, and, when the measurement information indicating that it is confirmed that the component is correct is not present, a process in which the characteristic measuring unit 40 is caused to measure the electrical characteristics of the component P which is stored in the reel 55 before the execution of the mounting process. In this manner, in the mounting process device 20 measures the electrical characteristics of the component P by the characteristic measuring unit 40 at least once, and is configured to perform a process in which the component P is mounted on the printed circuit board after confirming whether the component is correct.

The memory section 26 is configured as a memory device which stores data in a re-writable manner such as an HDD or a flash memory. The device information 26a, mounting process condition information 26b, and the like which are used during the execution of the mounting process to mount the component P on the printed circuit board are stored in the memory section 26. The mounting process condition information 26b and the device information 26a are information which is managed by the mounting management server 60, and the content is the same as device information 72 and mounting process condition information 74, therefore, detailed description will be given later (refer to FIG. 5). The device information 26a and the mounting process condition information 26b are transmitted from the mounting management server 60 and stored in the memory section 26 before executing the mounting process.

The I/F 27 is configured as an interface which performs transactions of information with external devices which are connected to the network or the like and is provided with a reception section 28 and a transmission section 29. The I/F 27 transmits information to the LAN 12 via the transmission section 29 and receives information from the LAN 12 via the reception section 28.

The printed circuit board processing unit 30 is provided with a printed circuit board conveyance section 31 which transports the printed circuit board to a predetermined mounting position at which the component P is mounted, and a printed circuit board holding section 32 which clamps the transported printed circuit board in the mounting position. The printed circuit board conveyance section 31 is configured as a device which transports the printed circuit board using a belt conveyor, for example, and is provided with a guide member which is provided on each of a pair of side frames, a conveyor belt which is provided on each of the pair of side frames, and a belt revolution device which causes the conveyor belt to drive in a revolving manner. The printed circuit board holding section 32 is disposed at every predetermined mounting position, and is provided with, for example, a support device which supports the printed circuit board from below, and a clamp device which clamps the edge portions of the printed circuit board.

The pick-and-place processing unit 33 is provided with a head moving section 34 which subjects a mounting head 35 to a moving process, the mounting head 35 which is installed in the head moving section 34, and a suction nozzle which is installed in the mounting head 35 and is capable of moving in the Z-axis direction. The head moving section 34 is capable of moving in the X direction due to an X direction slider which is not depicted in the drawings, and is capable of moving in the Y direction due to a Y direction slider which is not depicted in the drawings. The mounting head 35 is installed in the head moving section 34, and the mounting head 35 also moves in the X and Y directions together with the movement of the head moving section 34 in the X and Y directions. A Z-axis motor (not shown) is embedded in the mounting head 35, and the height of the suction nozzle 36 which is attached to a ball screw (not shown) of the Z-axis direction is adjusted by the Z-axis motor. Note that, the X and Y directions refers to the directions of two axes which orthogonally intersect within a horizontal plane, and the Z axis refers to the axis of a perpendicular direction. The suction nozzle 36 sucks the component to the nozzle distal end, releases the component which is sucked to the nozzle distal end, and the like using pressure. In the suction nozzle 36, piping which is not depicted in the drawings is connected, a negative pressure is supplied to the nozzle distal end via the piping during the suction of the component to the nozzle distal end, and a positive pressure is supplied to the nozzle distal end via the piping when releasing the component which is sucked to the nozzle distal end. Note that, it is possible to exchange the suction nozzle 36 for one which is appropriate to the size and shape of the component. Here, although the component is mounted using the suction nozzle 36 which is installed in the mounting head 35, for example, a configuration may be adopted in which a chuck (a component holding unit) which grasps and holds the component P using opening-closing claws or the like is attached to the mounting head 35, the component P is picked up from the supply unit 37 using the chuck, and the component P is mounted on the printed circuit board.

The supply unit 37 is provided with a installation section in which a feeder 50 is installed, and a cutting section which cuts and removes the tape from which the component P has been picked up. One or more of the feeders 50 which supply the component P from the reel 55 are installed in the supply unit 37. The feeder 50 is provided with a control section 51 which controls the feeder 50, a memory section 52 which stores information relating to the feeder 50, a tape feeder unit which feeds out the tape which is wound around the reel 55 to the pickup position and is not depicted in the drawings, and the reel 55 around which the tape in which the components P are stored is wound. In the memory section 52, the feeder ID which is the identifier of the feeder 50, for example, is stored as the information relating to the feeder 50, and it is possible to store the reel ID which is the identifier of the reel 55, the component ID which is the identifier of the component P which is stored in the reel 55, and the like as other information. When the feeder 50 is installed in the supply unit 37, the control section 51 performs communication with the mounting machine controller 22, and performs a process in which the information (for example, the feeder ID and the like) relating to the feeder 50 which is stored in the memory section 52 is output. The control section 51 controls the tape feeder unit to feed out the tape to a predetermined pickup position at which the component P which is stored in the reel 55 is sucked to by the suction nozzle 36. The reel 55 is provided with a tape in which a storage section which stores the component P and is not depicted in the drawings is formed, and a label 56 which describes the information relating to the stored component P and a bar-code 57 which identifies the reel 55 are stuck to the reel 55. Note that, in the mounting machine 21, in addition to the feeder 50, it is possible to install a tray supply unit which stores a plurality of trays on which a plurality of the components P are placed.

The imaging section 38 is disposed in the vicinity of the printed circuit board processing unit 30, and is a parts camera which images the component P which is in a state of being held by the suction nozzle 36. There is an imaging range above the imaging section 38, and, when the suction nozzle 36 which is sucked to the component P passes over the imaging section 38, the component P which is held in the suction nozzle 36 is imaged, and the image data thereof is output to the mounting machine controller 22.

The operation panel 39 is provided with a display unit which displays a screen, and an operation section which receives an input operation from a worker. The display unit is configured as a liquid crystal display, and displays, on a screen, the operation status and the setting status of the mounting machine 21. The operation section is provided with cursor keys which move a cursor up, down, left, or right, a cancel key which cancels the input, a decision key which decides the selected content, and the like, and is configured such that it is possible to key input an instruction of the worker.

Figure 3:
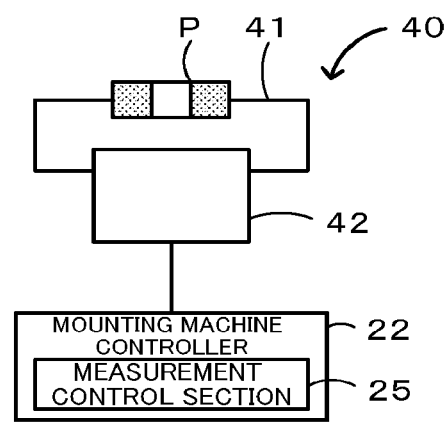
FIG. 3 is a configuration diagram schematically illustrating the configuration of a characteristic measuring unit 40.

The characteristic measuring unit 40 is configured as an LCR meter which measures the electrical characteristics of the component P such as, for example, inductance, capacitance, resistance, and impedance. As illustrated in FIG. 3, the characteristic measuring unit 40 is provided with terminals 41 which are connected to contacts of the component P, a measuring circuit 42, and the like. The characteristic measuring unit 40 is controlled by the measurement control section 25 of the mounting machine controller 22, and measures the electrical characteristics of the component P. The characteristic measuring unit 40 is provided within the movement range of the mounting head 35, and the component P which is the measurement target is sucked to the suction nozzle 36, is moved, and is connected to the terminals 41. Here, the characteristic measuring unit 40 measures the resistance value of the component P.

The mounting management server 60 is the mounting management device of the disclosure, and is configured as a server which manages the electronic component mounting system 10. As illustrated in FIG. 4, the mounting management server 60 is provided with a management device controller 61 which manages the control of the overall device, a memory section 65 which stores various application programs and various data files, a display 66 which displays various information, an input device 67 such as a keyboard and a mouse with which the worker inputs various commands, and an I/F 68 which performs communication with external devices such as the mounting process device 20, the PC 15, and the measurement PC 80.

The management device controller 61 is configured as a micro processor centered on a CPU which is not depicted in the drawings and is provided with flash memory in which various processing programs and the like are stored, and a RAM which stores data temporarily. The mounting management server 60 has a function of executing an operation corresponding to an input operation when a worker performs the input operation of a cursor or the like which is displayed on the display 66 via the input device 67. The management device controller 61 is electrically connected to the memory section 65, the display 66, the input device 67, the I/F 68, and the like using a bus 69. The mounting management server 60 commands the mounting process device 20 to perform the mounting process using an installed program, displays the information of the mounting process device 20, and the like. The management device controller 61 outputs information to the mounting process device 20, the PC 15, the measurement PC 80, and the like via the I/F 68, outputs display data to the display 66, and the like. The management device controller 61 receives input of information from the mounting process device 20, the PC 15, the measurement PC 80, and the like via the I/F 68, receives input of signals from the input device 67, and the like.

The mounting management server 60 is provided with an information acquisition section 62, an output control section 63, and a management determination section 64 as functional blocks of the management device controller 61. The information acquisition section 62 performs a process of acquiring the measurement information relating to the results of measuring the component P which is stored in the reel 55 via the I/F 68. The information acquisition section 62 performs a process of acquiring the modified content of the device information 72 and the mounting process condition information 74. The output control section 63 has a function of performing a process in which the measurement information corresponding to the reel 55 is read from the device information 72, or, the device information 72 is output as it is to an external device such as the mounting process device 20 or the PC 15 via the I/F 68. The management determination section 64 performs a process of determining whether or not the reel 55 and the measured component P are in the correct correspondence relationship based on the information of the reel 55 and the measurement result information of the component P which is stored in the reel 55.

Figure 5:
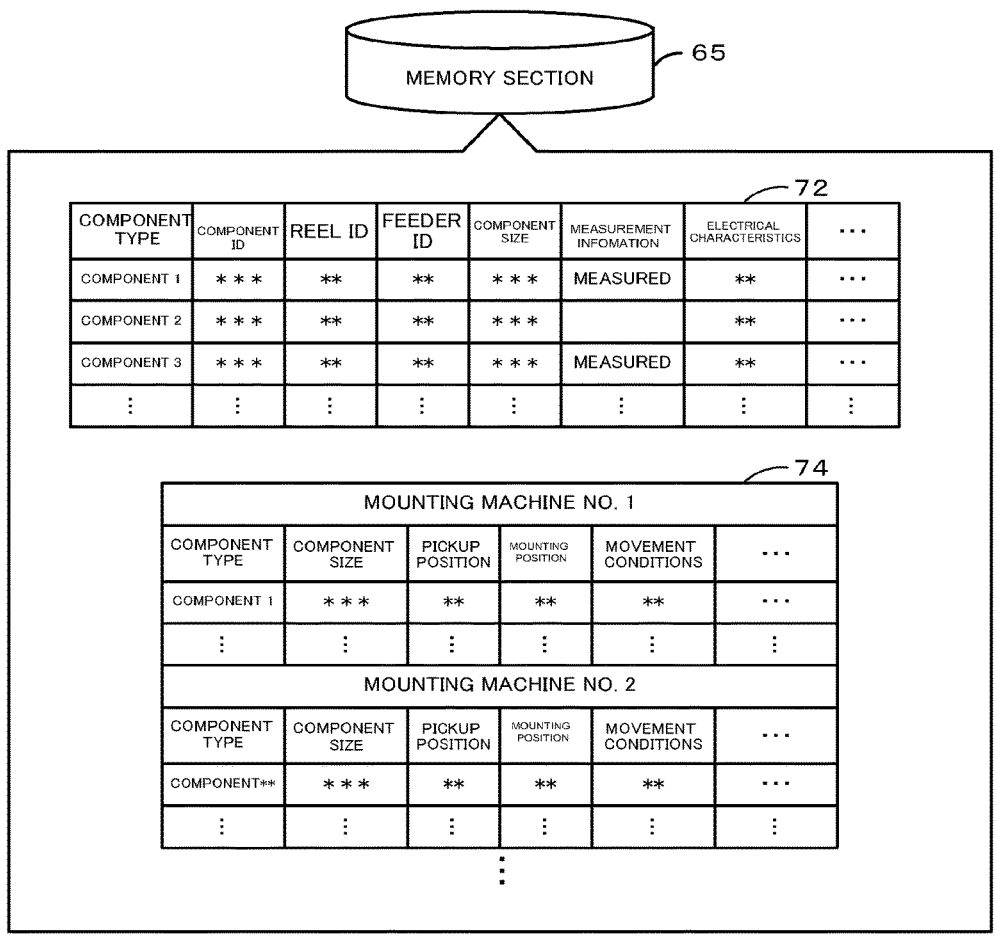
FIG. 5 is an explanatory diagram of information which is stored in a memory section 65.

The memory section 65 is a large capacity memory such as an HDD, for example, and the device information 72 which stores the correspondence relationship between the component P, the reel 55, and the feeder 50, the mounting process condition information 74 which is set for each of the mounting process devices 20, and the like are stored in the memory section 65. FIG. 5 is an explanatory diagram of the device information 72 and the mounting process condition information 74 which are stored in the memory section 65. Information indicating that the component ID which is the identifier of the component P, the reel ID which is the identifier of the reel 55 in which the component P is stored, the feeder ID which is the identifier of the feeder 50 in which the reel 55 is installed, the component size, the measurement information indicating whether the electrical characteristics of the component P have been measured (have been confirmed), and a reference value (for example, a catalog value) of the electrical characteristics of the component P are associated corresponding to each of the components P is stored in the device information 72. In addition to the type of the component, the size of the component, the pickup position (XY coordinates on the device) of the component, the mounting position (XY coordinates on the device) of the component, and movement conditions including the movement speed when carrying the component and the like, information such as the order in which the components are mounted on the printed circuit board is stored in the mounting process condition information 74 as mounting conditions in each of the mounting machines 21. The reference value of the electrical characteristics of the component P may be stored in the mounting process condition information 74.

The I/F 68 is configured as an interface which performs transactions of information with external devices which are connected to the network or the like, and, outputs information to the LAN 12 and acquires information from the LAN 12.

As illustrated in FIG. 1, the measurement PC 80 is configured as an information terminal which a worker related to the electronic component mounting system 10 uses, and is provided with a controller 82 which manages the control of the overall device, and a memory device 83 which stores various application programs and various data files. The measurement PC 80 is provided with a display 84 which displays various information, an input device 85 such as a keyboard and a mouse with which the worker inputs various commands, and an I/F 86 which performs communication with external devices such as the mounting process device 20, the mounting management server 60, and the like. The measurement PC 80 has a function of executing an operation corresponding to an input operation when a worker performs the input operation of a cursor or the like which is displayed on the display 84 via the input device 85. The controller 82 is electrically connected to the memory device 83, the display 84, the input device 85, the I/F 86, and the like using a bus. The controller 82 outputs information to the mounting process device 20, the mounting management server 60, and the like via the I/F 86, outputs display data to the display 84, and the like. The controller 82 receives input of information from the mounting process device 20, the mounting management server 60, and the like via the I/F 86, receives input of signals from the input device 85, and the like.

A measurement device 87 is connected to the measurement PC 80. The measurement device 87 is provided with a characteristic measuring unit 88 which measures the electrical characteristics of the component P, and a measurement control section 89 which controls the characteristic measuring unit 88. Since the characteristic measuring unit 88 is configured in the same manner as the characteristic measuring unit 40 described above and the measurement control section 89 is configured in the same manner as the measurement control section 25, description thereof will be omitted. In the measurement device 87, when a worker connects the component P to the terminals which are not depicted in the drawings and inputs a measurement instruction in a measurement screen which is not depicted in the drawings, the electrical characteristics of the component P are measured. In the measurement PC 80, the new measurement information is registered in the device information 72 which is managed by the mounting management server 60, and an update program which updates the device information 72 is stored in the memory device 83. In this update program, for example, after the component P is picked up from the reel 55 and the component ID and the reel ID thereof are selected, the measurement of the component P is performed, and, when the measured electrical characteristics (for example, 1Ω) are within a normal range (for example, 1.1Ω or the like), the measurement information of the device information 72 corresponding to the component P is registered.

Note that, the functional blocks which are described above may be realized by a controller executing software, and may be realized in hardware using a circuit or the like.

Next, description will be given of the operations of the electronic component mounting system 10 of the present embodiment which is configured in this manner, starting from the management during the warehousing of the reel 55. As illustrated in FIG. 1, in the warehousing area 11, the worker performs work of confirming the label 56 which is stuck to the warehoused reel 55, printing the reel ID as the bar-code 57 with the assumption that the component which is described on the label 56 is enclosed, and sticking the printed bar-code 57 to the reel 55. Next, the worker installs the reel 55 in the feeder 50, and, for example, acquires the feeder ID which is the identifier of the feeder 50 by reading from the memory section 52 or the like. Subsequently, the worker performs work of operating the PC 15, and registering information indicating that the component ID of the component P, the reel ID, the feeder ID, the component size, the electrical characteristics (for example, the resistance value of the component) of the component P, and the like are associated in the device information 72 which is stored in the memory section 65 of the mounting management server 60. Therefore, in the mounting management server 60, the device information 72 in which the information of the component (refer to component 2 of FIG. 5) is registered is stored in the memory section 65. Since the electrical characteristics of the component are not measured in the information, the measurement information is not yet registered. As described hereinafter, in the mounting process device 20, the mounting process of the component P is performed using the feeder 50, the device information 72, the mounting process condition information 74, and the like.

Figure 6:
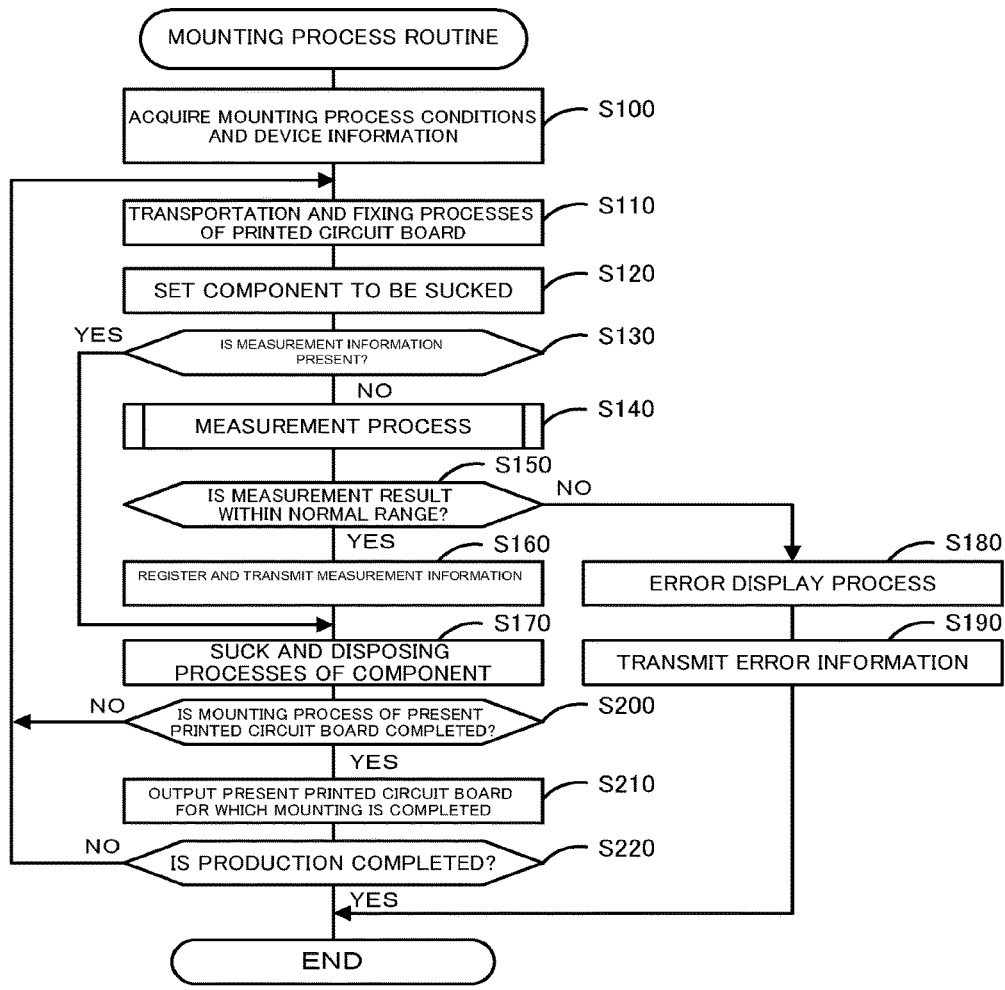
FIG. 6 is a flowchart illustrating an example of a mounting process routine.

Next, description will be given of the mounting process to mount the component P to the printed circuit board by the mounting process device 20. FIG. 6 is a flowchart illustrating an example of the mounting process routine which is executed by the CPU of the mounting machine controller 22 which is provided in the mounting machine 21. This routine is stored in the memory section 26, and is executed after the mounting process execution input of the worker in a mounting process screen which is not depicted in the drawings. This routine is executed using each of the functional blocks and each of the units of the mounting machine controller 22. When the mounting process is executed, the CPU of the mounting machine controller 22 first acquires the device information 72 and the mounting process condition information 74 from the mounting management server 60, and stores the acquired information in the memory section 26 as the device information 26a and the mounting process condition information 26b (step S100). Next, the CPU executes the transporting and the clamping process of the printed circuit board (step S110), and sets the component to be mounted on the printed circuit board (step S120). The mounting order of the components is acquired by reading the information which is stored in the mounting process condition information 26b.

Next, the CPU of the mounting machine controller 22 determines whether or not the electrical characteristics of the component P has already been measured based on whether or not the measurement information corresponding to the component P to be mounted is present in the device information 72 (step S130). When the measurement information corresponding to the component P to be mounted is not present, and the electrical characteristics of the component P have not been measured, the CPU temporarily interrupts the execution of the mounting process, and executes the measurement process of the electrical characteristics of the component P using the characteristic measuring unit 40 (step S140). As described above, in the series of work tasks in the warehousing area 11, mistakes can happen such as, for example, the vendor sticking the wrong label 56, the vendor storing the component P in the wrong reel 55, the worker sticking the wrong bar-code 57 to the reel 55, and the like. In such a case, the component P which is stored in the reel 55 differs from the component which is registered in the mounting process condition information 26b, and the electrical characteristic value is not correct. Therefore, in the electronic component mounting system 10, when performing the mounting of the component P, whether the component to be mounted is correct is confirmed by measuring the electrical characteristics. Note that, the mounting process condition information 74 and the mounting process condition information 26b correspond to plans of mounting printed circuit boards, and this is assumed to be the most correct information. In the measurement process, a process is performed in which one or more (for example, three or the like) of the components P from the leading portion of the reel 55 in which the corresponding components P are stored are sucked to the suction nozzle 36, moved and placed on the terminals 41 of the characteristic measuring unit 40, and the electrical characteristics are measured by the measuring circuit 42. Next, the CPU determines whether or not the correct component is stored in the reel 55 based on whether or not the measurement results are within a normal range (step S150). In the determination, it is determined whether or not the measurement value (for example, an average value) is within a permissible range (for example the upper and lower limits are 20% or less, or the like) in relation to the electrical characteristic value which is stored in the device information 26a (or the mounting process condition information 26b), and it is determined whether or not the reel and the component P are in the correct correspondence relationship. When the measurement results are within the normal range, the CPU assumes that the correct component P is stored in the reel 55 and registers the measurement information of the corresponding component P in the device information 26a, transmits the same information to the mounting management server 60, and registers the measurement information in the device information 72 (step S160).

Meanwhile, when the measurement result in step S150 is not within the normal range, the CPU of the mounting machine controller 22 assumes that the wrong component P is stored in the reel 55, causes a message or the like indicating this to be displayed on the operation panel 39, performs an error display process, also alarming of a warning sound or the like (step S180), and, for example, transmits the error information to the mounting management server 60 (step S190) and ends the routine in this state. In other words, the CPU stops the mounting process of the component P. In this manner, in the mounting process device 20, when the measurement information is not present, the electrical characteristics of the component P are confirmed, and the mounting process is interrupted when the component P is determined to be wrong. Note that, as the error information to be transmitted, information may be adopted indicating that the wrong component is stored in the reel 55 of the component P which is measured this time. Here, although the routine is ended in this state, the mounting process may be capable of restarting, for example, after displaying the error, when the feeder 50 is exchanged, the processes from step S140 onward are performed.

After the step S160, or, when the measurement information is present in step S130, the CPU of the mounting machine controller 22 executes the mounting process of the component P (step S170). For example, there are cases in which the feeder 50 is removed from the supply unit 37 and temporarily kept in a warehouse, is attached to a different mounting machine 21, or the like. In the mounting process device, it is conceivable to perform the measurement of the electrical characteristics of the stored component P every time this re-installation takes place. Here, when the measurement information is present in step S130, that is, when measurement results are obtained which indicate that the corresponding component P is stored in the correct reel 55, the mounting process is performed without performing the re-measurement of the corresponding component P. In this case, it is possible to further suppress the number of times the component P is measured by the characteristic measuring unit 40. After step S160, the mounting process device 20 can restart the mounting process after interrupting the mounting process in the measurement process of the electrical characteristics. In the mounting process of step S170, the CPU of the mounting machine controller 22 moves the mounting head 35 to the pickup position of the component to be mounted on the printed circuit board based on the pickup position, the mounting position, the movement conditions, and the like of the component which are stored in the mounting process condition information 26b. The CPU allows the suction nozzle 36 to suck the component by supplying a negative pressure to the suction nozzle 36, the mounting head 35 to move to the position of the printed circuit board, and subsequently the suction nozzle 36 to be supplied with a positive pressure to mount the component in the mounting position. Note that, in the mounting process device 20, it is possible to image the component P using the imaging section 38 and determine whether or not the component P is the wrong component based on the size of the imaged component P after sucking the component P to the suction nozzle 36.

Subsequently, the CPU of the mounting machine controller 22 determines whether or not the mounting process of the present printed circuit board is completed based on whether or not all of the components to be mounted on the printed circuit board have been mounted by the mounting machine 21 (step S200), and when the mounting process is not completed, the processes from step S110 onward are executed. In other words, the CPU performs the outputting of the printed circuit board and the transportation of the new printed circuit board, sets the component P to be mounted according to the predetermined order of the components, and executes the measurement process and the mounting process. Meanwhile, when the mounting process is completed in step S200, the CPU transports the printed circuit board for which the mounting has been performed (step S210), and determines whether or not the production is completed based on whether or not the mounting process has been performed on all of the printed circuit boards (step S220). When the production is not completed, the CPU repeats the processes from step S110 onward, whereas when this process is executed on all of the printed circuit boards, the routine is ended in this state.

Figure 7:
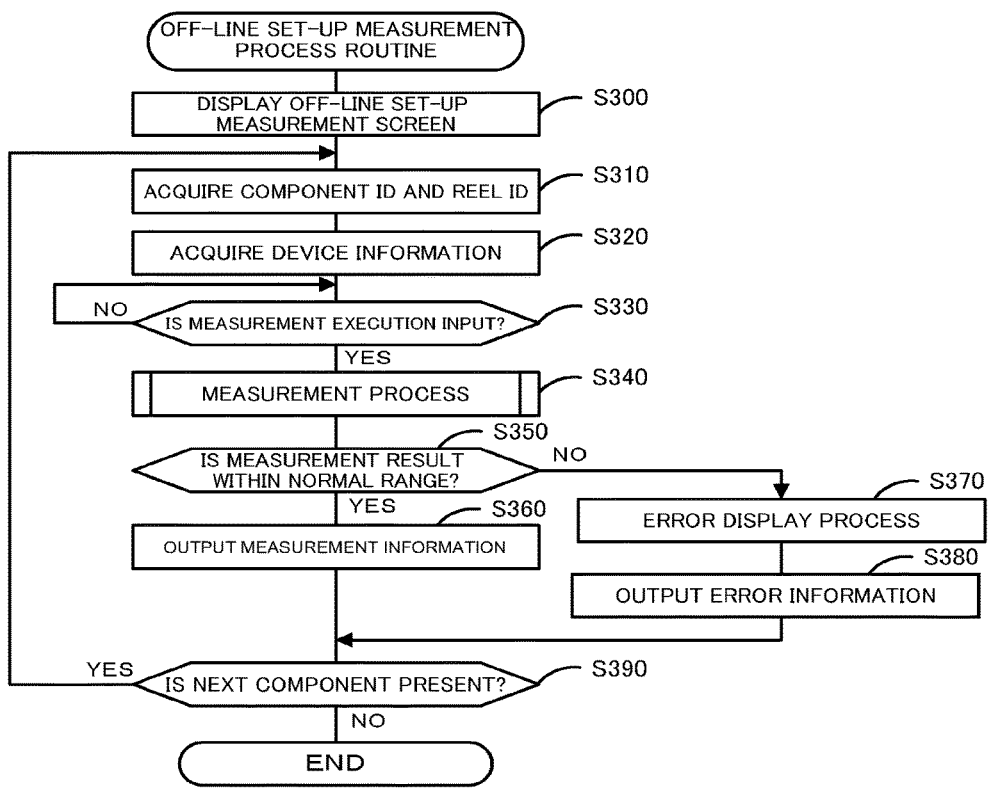
FIG. 7 is a flowchart illustrating an example of an off-line set-up measurement process routine.

Next, description will be given of a process in which the electrical characteristics of the component P are measured by the measurement PC 80 and the measurement information is registered in the device information 72. FIG. 7 is a flowchart illustrating an example of an off-line set-up measurement process routine which is executed by the CPU of the controller 82 which is provided in the measurement PC 80. This routine is stored in the memory device 83, and is executed after the off-line set-up measurement program is started. In addition to being performed in a case in which, for example, the electrical characteristics of the component P are measured by the measurement PC 80 in advance based on a mounting process in the mounting machine 21 which is not provided with the characteristic measuring unit 40, the off-line set-up measurement process is performed in a case in which the measurement is performed outside of the mounting machine 21 when a worker has excess time or the like, and the measurement time in the mounting process is reduced, or the like. When executing the measurement process, the CPU of the measurement PC 80 first displays an off-line set-up measurement screen which is not depicted in the drawings (step S300), and acquires the component ID and the reel ID (step S310). A measurement execution key which is pressed when starting the measurement, an end key which is pressed when ending the measurement, and the like are arranged in the off-line set-up measurement screen in addition to a component ID input field, a reel ID input field, a component information display field which displays the name, size, electrical characteristics (the reference value or the like), and the like of the selected component, and an error information display field which displays error information and the like. The component ID and the reel ID may be acquired from being input to the input fields of the off-line set-up measurement screen, or, may be acquired by reading the bar-code 57 or the like using a bar-code reader which is not depicted in the drawings. Next, the CPU acquires the device information which matches the component ID and the reel ID which are acquired from the mounting management server 60 (step S320), and determines whether or not input of the measurement execution of the component P has been executed based on whether or not the measurement execution key of the off-line set-up measurement screen has been pressed (step S330). Note that, in the input device information of the component P, the information other than the measurement information is registered in the warehousing area 11. At this time, the worker takes out the component P from the reel 55, for example, and performs work of connecting the taken component P to the terminals, which are not depicted in the drawings, of the characteristic measuring unit 88.

When there is no input of the measurement execution of the component P, the CPU of the controller 82 waits as it is, and when there is input of the measurement execution of the component P, the CPU executes the measurement process of the electrical characteristics of the component P (step S340). In the measurement process, the CPU measures the electrical characteristics (the resistance value or the like) of the component P using the measuring circuit of the characteristic measuring unit 88. Next, the CPU determines whether or not the measurement result is within the normal range (step S350), and when the measurement result is within the normal range, the CPU transmits the measurement information to the mounting management server 60 assuming that the correct component P is stored in the reel 55, and registers the measurement information in the device information 72 (step S360). In step S350, the same process as step S150 described above is performed. Meanwhile, when the measurement result is not within the normal range in step S350, the CPU assumes that the wrong component P is stored in the reel 55, causes the display 84 to display a message or the like indicating this fact, performs an error display process (step S370), and, for example, transmits error information to the mounting management server 60 (step S380). After step S380, or, after step S360, the CPU determines whether or not a component to be measured next is present based on whether or not the end key of the off-line set-up measurement screen has been pressed (step S390), and, when the next component is present, repeatedly executes the processes from step S310 onward. Meanwhile, when the next component is not present, the CPU ends the routine in this state. In this manner, it is possible to register the measurement information in the mounting process condition information 74 using a different device from the mounting process device 20.

Figure 8:
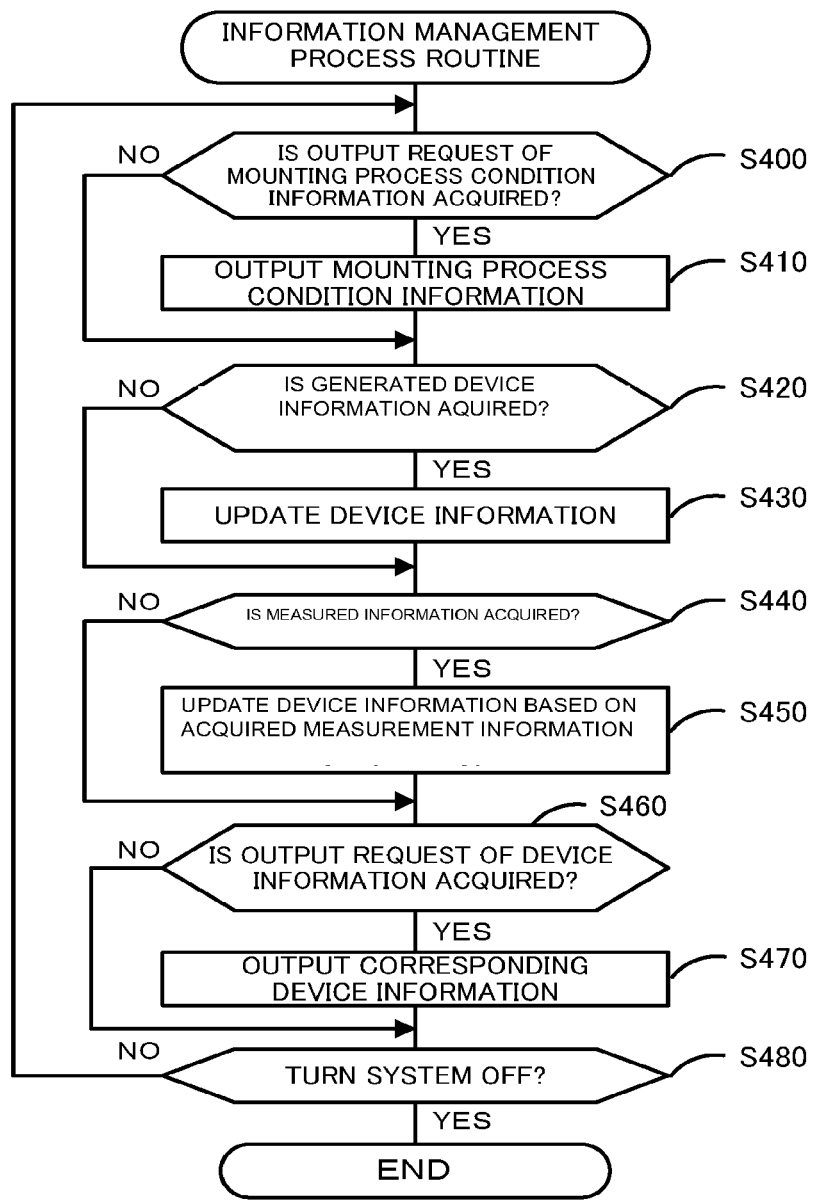
FIG. 8 is a flowchart illustrating an example of an information management routine.

Next, description will be given of a process in which the information of the component P is managed in the mounting management server 60. FIG. 8 is a flowchart illustrating an example of an information management routine. This routine is stored in the memory section 65, and is executed by the CPU of the management device controller 61 after the system is started. This routine is executed using the functional blocks and the like of the management device controller 61. When the information management process is executed, the CPU of the management device controller 61 first determines whether an output request of the mounting process condition information 74 has been acquired (step S400). The output request is, for example, output in step S100 of the mounting process routine. When the output request of the mounting process condition information 74 is acquired, the CPU outputs the corresponding mounting process condition information 74 to the requesting mounting machine 21 via the I/F 68 (step S410). After step S410, or when the output request is not acquired in step S400, the CPU determines whether or not the device information which is generated by an external device has been acquired (step S420). The device information may be acquired from the PC 15, for example. When the device information is received, the CPU updates the acquired device information as the device information 72 (step S430).

After step S430, or when the device information is not acquired in step S420, the CPU of the management device controller 61 determines whether or not the measurement information has been acquired (step S440). The measurement information may be, for example, output in step S160 of the mounting process routine or step S360 of the off-line set-up measurement process routine. When the measurement information is acquired, the CPU updates the device information 72 based on the acquired measurement information (step S450). After step S450, or when the measurement information is not acquired in step S440, the CPU determines whether or not the output request of the device information has been acquired from an external device (step S460). The output request of the device information is output in step S100 of the mounting process routine, for example. When the output request of the device information is acquired, the CPU outputs the corresponding device information 72 to the requesting mounting machine 21 (step S470). After step S470, or when the output request is not acquired in step S460, the CPU determines whether or not the system has been turned off, and when the system has not been turned off, repeatedly executes the processes from step S400 onward. Meanwhile, when the system has been turned off, the CPU ends the routine in this state. In this manner, the information management of the device information 72 and the like is performed. Note that, here, although the updating and outputting processes of each item of information are performed in the information management process routine, each of the processes may be performed in a respective separate routine.

Here, the correspondence relationship between the constituent elements of the present embodiment and the constituent elements of the disclosure will be made clear. The information acquisition section 62 of the present embodiment corresponds to information acquisition device of the disclosure, the memory section 65 corresponds to information storage device, the output control section 63 corresponds to output control device, and the management determination section 64 corresponds to management determination device. The reception section 28 corresponds to reception device, the transmission section 29 corresponds to transmission device, the mounting control section 23 corresponds to mounting control device, the characteristic measuring unit 40 corresponds to measuring device, the measurement control section 25 corresponds to measurement control device, and the mounting determination section 24 corresponds to mounting determination device. The reel 55 corresponds to a storage section. Note that, in the present embodiment, an example of a mounting management method and a mounting process method of the disclosure will also be made clear by description of the operation of the electronic mounting system 10.

According to the electronic component mounting system 10 which is described above, the mounting management server 60 acquires the measurement information relating to the result obtained by measuring the component P which is stored in the reel 55 from the mounting machine 21 or the measurement PC 80, registers the acquired measurement information in the device information 72 registered in association with the reel ID, and outputs the measurement information corresponding to the reel 55 to the mounting machine 21 or the like. In this manner, the result obtained by measuring the component is registered and managed in the device information 72, for example, the measurement information is output according to a request from a worker, the mounting machine 21, or the like. There are cases in which the component which is installed in the device must be re-measured such as when the feeder 50 in which the reel 55 is installed is removed, stored, and subsequently reinstalled, and when the power of the mounting process device 20 is turned off and subsequently turned back on. Here, since it is not necessary to perform the re-measurement of the component due to using the measurement information, it is possible to further reduce the frequency of the confirmation measurement of the component and to execute the mounting process more smoothly. Since the measurement information relating to information indicating that the correct component is stored in the reel 55 is acquired, it is possible to further reduce the frequency of the confirmation measurement of the component and to execute the mounting process more smoothly.

The mounting process device 20 receives the device information in which the measurement information that relates to the result obtained by measurement of the component P stored in the reel 55 and that is associated with the reel ID is registered, when the measurement information is present in the device information of the component to be mounted, the mounting process device 20 executes the mounting process of the component. In this manner, since it is not necessary to perform the re-measurement of the component due to using the measurement information of the received device information because the mounting process is executed according to the measurement information, it is possible to further reduce the frequency of the confirmation measurement of the component and to execute the mounting process more smoothly. Since the execution of the mounting process is interrupted temporarily when the measurement information is not present, it is possible to prevent the erroneous mounting of the component, and it is possible to execute the mounting process more smoothly. Furthermore, when the measurement information relating to the component P which is stored in the reel 55 is not present, since the electrical characteristics of the component which is stored in the reel 55 are measured before the execution of the mounting process, it is possible to further prevent the erroneous mounting of the component. Furthermore, since it is determined whether or not the reel 55 and the measurement component P are in the correct correspondence relationship and the measurement information relating to information indicating that the correct component P is stored in the reel 55 is transmitted to the mounting management server 60, it is possible to manage the measurement information in the mounting management server 60 using the measurement information which is obtained in the mounting process device 20. Since the electronic component mounting system 10 is provided with the mounting process device 20 and the mounting management server 60, it is possible to obtain the effects corresponding to the modes which are adopted by these devices.

Note that, the disclosure is not limited to the embodiment described above, and, needless to say, may be implemented in various modes within the technical scope of the disclosure.

For example, in the embodiment described above, the mounting process device 20 receives the device information from the mounting management server 60 and stores the measurement information of the device information and performs the mounting process and the measurement process in this state; however, the disclosure is not particularly limited thereto as long as "the mounting process of the component P is executed when the measurement information is present". For example, when the mounting management server 60 acquires query information relating to whether the component P which is stored in the reel 55 has been measured from the mounting process device 20, the mounting management server 60 may read the device information 72 corresponding to the reel 55 of the query information, and, when the measurement information is registered in the read device information 72, may output the measurement information to the mounting process device 20. The mounting process device 20 may transmit the query information relating to whether the component P has been measured to the mounting management server 60, receive the response information relating to the query information, determine whether or not the response information contains the measurement information, and, when the measurement information is present, may execute the mounting process of the component P. In other words, a mode may be adopted in which the mounting management server 60 is queried from the mounting process device 20 for every component as to whether or not the measurement information is present. In this case, by querying the mounting management server 60 from the mounting process device 20, it is possible to further reduce the frequency of the confirmation measurement of the component and to execute the mounting process more smoothly. At this time, the mounting management server 60 may output non-measurement information to the mounting process device 20 when the measurement information is not registered in the read device information 72. In this case, it is possible to prevent the erroneous mounting of the component in the mounting process device using the non-measurement information. Note that, if the measurement information which is output from the mounting management server 60 is information indicating that the measurement has been performed, the measurement information is not particularly limited and it is not necessarily the data itself which is registered in the device information 72.

In the embodiment described above, whether or not the reel 55 and the measured component P have the correct correspondence relationship is determined in the mounting process device 20 side and the measurement PC 80 side; however, the disclosure is not limited thereto, and the determination may be performed by the mounting management server 60. For example, the mounting management server 60 may acquire a measurement value (measurement result information) of the component P which is stored in the reel 55 from the mounting process device 20 or the measurement PC 80, and whether or not the reel 55 and the measured component P have the correct correspondence relationship may be determined by the management determination section 64. At this time, the information acquisition section 62 of the mounting management server 60 may acquire the measurement information from the management determination section 64 according to the determination results of the management determination section 64. The mounting process device 20 may transmit the measurement value (the measurement result information) of the characteristic measuring unit 40 to the mounting management server 60. In this case, since it is possible to use the measurement result of the component in the mounting management server 60, it is possible to register the measurement information in the mounting management server 60.

In the embodiment described above, both the component ID and the reel ID are registered as the device information 72; however, the disclosure is not limited thereto, and, for example, at least one of the component ID and the reel ID may be registered. It is possible to use the component ID and the reel ID as information relating to the storage section, and, if at least one of these and the measurement information are associated, it is possible to use the device information on the mounting process device 20 side. For example, after the registration in the warehousing area 11, if the component P which is stored in the storage section is in a pair relationship without being switched to another storage section, if the reel ID is registered, the component ID may not be registered. Alternatively, when the component is delivered from a vendor in a state in which the reel is not present, if the component ID is registered, the reel ID or the ID of the storage section which is used in storing the component instead of a reel may not be provided and registered.

In the embodiment described above, the error information is output to the mounting management server 60 in the mounting process routine or the off-line set-up measurement process routine; however, the error information may be registered in the device information 72, for example. In this case, it is possible to prevent the usage of the reel 55 in which the wrong component is stored by using the error information.

In the embodiment described above, the mounting process device 20 and the mounting management server 60 are separate devices; however, the disclosure is not limited thereto, and the mounting process device 20 may have the function of the mounting management server 60. Alternatively, the mounting management server 60 may have the function of the measurement PC 80. Alternatively, the measurement PC 80 may have the function of the PC 15. In this manner, the PC 15, the mounting process device 20, the mounting management server 60, and the measurement PC 80 may be provided with one or more of these functions, as appropriate.

In the embodiment described above, when the measurement information is not present, the measurement process is performed; however, the disclosure is not particularly limited thereto, and, for example, may perform a display process indicating that the measurement information is not present and temporarily interrupt the mounting process. Subsequently, when the confirmation input and the restart input are performed, the mounting process may be restarted. In this case, it is possible to use a system which uses the measurement information even in a mounting process device which is not provided with the characteristic measuring unit 40.

In the embodiment described above, the reel 55 is described as the storage section; however, the disclosure is not limited thereto as long as the relationship between the component and the storage section is present, and a tray or the like on which the component is placed may be used.

In the embodiment described above, the electrical characteristics of the component P are measured; however, the disclosure is not limited thereto as long as it is possible to recognize that the component which is stored in the storage section is correct, the size of the component may be used, and an identifier which is formed on the surface of the component may be used.

In the embodiment described above, description is given of the mounting management server 60 as the mounting management device of the disclosure, and the mounting process device 20 as the mounting process device of the disclosure; however, the disclosure is not limited thereto, and a mode of a mounting management method and the program thereof, or a mode of a mounting process method and the program thereof may be used.

INDUSTRIAL APPLICABILITY

It is possible to use the disclosure in the field of electronic component mounting.

REFERENCE SIGNS LIST

10: electronic component mounting system, 11: warehousing area, 12: LAN, 15: PC, 16: printer, 18: sheet, 20: mounting process device, 21: mounting machine, 22: mounting machine controller, 23: mounting control section, 24: mounting determination section, 25: measurement control section, 26: memory section, 26*a*: device information, 26*b*: mounting process condition information, 27: network interface (I/F), 28: reception section, 29: transmission section, 30: printed circuit board processing unit, 31: printed circuit board conveyance section, 32: printed circuit board holding section, 33: pick-and-place processing unit, 34: head moving section, 35: mounting head, 36: suction nozzle, 37: supply unit, 38: imaging section, 39: operation panel, 40: characteristic measuring unit, 41: terminal, 42: measuring circuit, 50: feeder, 51: control section, 52: memory section, 55: reel, 56: label, 57: bar-code, 60: mounting management server, 61: management device controller, 62: information acquisition section, 63: output control section, 64: management determination section, 65: memory section, 66: display, 67: input device, 68: I/F, 69: bus, 72: device information, 74: mounting process condition information, 80: measurement PC, 82: controller, 83: memory device, 84: display, 85: input device, 86: I/F, 87: measurement device, 88: characteristic measuring unit, 89: measurement control section, P: component

The invention claimed is:

1. A mounting management device that manages information relating to a component of a mounting process device in which a storage section with the component stored therein is installed and which executes a mounting process to mount the component on a printed circuit board, the mounting management device comprising:
    an interface that performs communication with a measurement device which measures an electrical characteristic of the component;
    an information acquisition device that acquires measurement information from the interface relating to a result obtained by measurement of the electrical characteristic of the component as measured by the measurement device which is stored in the storage section;
    an information storage device that stores device information in which the acquired measurement information that is associated with information relating to the storage section is registered; and
    an output control device that outputs the measurement information corresponding to the storage section to at least one of the mounting process device and an external device.

2. The mounting management device according to claim 1,
    wherein when the output control device acquires query information relating to whether the component which is stored in the storage section which is installed in the mounting process device has been measured from the mounting process device, the device information corresponding to the storage section of the query information is read, and, if the measurement information has been registered in the read device information, the output control device outputs the measurement information to the mounting process device.

3. The mounting management device according to claim 1,
    wherein the information acquisition device acquires the measurement information relating to information indicating that a correct component is stored in the storage section.

4. The mounting management device according to claim 1, further comprising:
    a management determination device that determines whether or not the storage section and the measured component have a correct correspondence relationship based on information of the storage section and measurement result information of the component which is stored in the storage section,
    wherein the information acquisition device acquires the measurement information relating to the information indicating that the correct component is stored in the storage section.

5. A mounting system, comprising:
    a mounting management device according to claim 1;
    a mounting process device; and
    a measurement device which measures an electrical characteristic of a component.

6. A mounting process device which communicates with a mounting management device that manages information relating to a component, in which a storage section with the component stored therein is installed, and which executes a mounting process to mount the component on a printed circuit board, the mounting process device comprising:
- a reception device that receives information;
- a transmission device that transmits information; and
- a mounting control device that executes the mounting process of the component when measurement information relating to a result obtained by measurement of an electrical characteristic of the component stored in the storage section is present.

7. The mounting process device according to claim 6,
- wherein the transmission device transmits query information relating to whether the component which is stored in the installed storage section has been measured to the mounting management device,
- wherein the reception device receives response information relating to the query information, and
- wherein the mounting control device determines whether or not the response information contains the measurement information relating to the result obtained by measurement of the electrical characteristic of the component stored in the storage section, and, when the measurement information is present, executes the mounting process of the component.

8. The mounting process device according to claim 6,
- wherein the reception device receives device information in which the measurement information that is relating to the result obtained by measurement of the component stored in the storage section and that is associated with the information relating to the storage section is registered, and
- wherein when the measurement information is present in the device information of the component to be mounted, the mounting control device executes the mounting process of the component.

9. The mounting process device according to claim 6,
- wherein the mounting control device interrupts execution of the mounting process when the measurement information is not present.

10. The mounting process device according to claim 6, further comprising:
- a measuring device that measures the component which is stored in the storage section; and
- a measurement control device that causes the measuring device to measure the component which is stored in the storage section before execution of the mounting process when the measurement information relating to the component which is stored in the storage section is not present.

11. The mounting process device according to claim 10,
- wherein the transmission device transmits the measurement result information to the mounting management device.

12. The mounting process device according to claim 10, further comprising:
- a mounting determination device that determines whether or not the storage section and the measured component have a correct correspondence relationship based on information of the storage section and measurement result information of the component which is stored in the storage section,
- wherein the transmission device transmits the measurement information relating to information indicating that the correct component is stored in the storage section to the mounting management device.

13. A mounting management method of managing information relating to a component of a mounting process device in which a storage section with the component stored therein is installed and which executes a mounting process to mount the component on a printed circuit board, the method comprising:
  (a) acquiring measurement information relating to a result obtained by measurement of an electrical characteristic of the component which is stored in the storage section;
  (b) storing device information in which the acquired measurement information that is associated with information relating to the storage section is registered; and
  (c) outputting the measurement information corresponding to the storage section to at least one of the mounting process device and an external device.

14. A mounting process method for communicating with a mounting management device that manages information relating to a component, installing a storage section with the component stored therein, and executing a mounting process to mount the component on a printed circuit board, the method comprising:
  (a) acquiring measurement information relating to a result obtained by measurement of an electrical characteristic of the component which is stored in the storage section;
  (b) storing device information in which the acquired measurement information that is associated with information relating to the storage section is registered;
  (c) outputting the measurement information corresponding to the storage section to at least one of the mounting process device and an external device; and
  (d) executing the mounting process when the measurement information relating to the result obtained by measurement of the electrical characteristic of the component which is stored in the storage section is present.

* * * * *